(12) United States Patent
Hung et al.

(10) Patent No.: US 7,409,660 B2
(45) Date of Patent: Aug. 5, 2008

(54) METHOD AND END CELL LIBRARY FOR AVOIDING SUBSTRATE NOISE IN AN INTEGRATED CIRCUIT

(75) Inventors: Chih-Ju Hung, Danshuei Township, Taipei County (TW); Xiang Matthew Song, Santa Clara, CA (US); Hsiao-Hui Wu, San Jose, CA (US); Kai Lai, Fremont, CA (US); Fredrick Jen, Los Altos, CA (US)

(73) Assignee: LSI Corporation, Milpitas, CA (US)

(*) Notice: Subject to any disclaimer, the term of this patent is extended or adjusted under 35 U.S.C. 154(b) by 246 days.

(21) Appl. No.: 11/324,105

(22) Filed: Dec. 29, 2005

(65) Prior Publication Data
US 2007/0157145 A1    Jul. 5, 2007

(51) Int. Cl.
*G06F 17/50* (2006.01)
*G06F 9/45* (2006.01)

(52) U.S. Cl. .................. 716/10; 257/127; 257/170; 257/401; 257/409; 257/484; 438/405

(58) Field of Classification Search ............... 716/1–21; 257/127, 170, 401, 409, 484
See application file for complete search history.

(56) References Cited

U.S. PATENT DOCUMENTS

| | | | | |
|---|---|---|---|---|
| 5,475,255 | A * | 12/1995 | Joardar et al. | 257/547 |
| 6,424,022 | B1 * | 7/2002 | Wu et al. | 257/665 |
| 6,879,023 | B1 * | 4/2005 | Gutierrez | 257/547 |
| 2006/0102980 | A1 * | 5/2006 | Nakashiba | 257/508 |

* cited by examiner

*Primary Examiner*—Jack Chiang
*Assistant Examiner*—Nghia M Doan
(74) *Attorney, Agent, or Firm*—Eric James Whitesell

(57) ABSTRACT

A method of avoiding substrate noise in an integrated circuit includes steps of receiving as input an integrated circuit design that includes at least a portion of a block for placement and routing on a substrate and an outer boundary of the block. An end cell is selected from a set of end cells for terminating the block in an outer area that extends from the outer boundary to an end cell boundary outside the block. The selected end cell is placed in the outer area to isolate the block electrically from the substrate.

17 Claims, 13 Drawing Sheets

METHOD AND END CELL LIBRARY FOR AVOIDING SUBSTRATE NOISE IN AN INTEGRATED CIRCUIT

BACKGROUND OF THE INVENTION

1. Field of the Invention

The present invention is directed to the design and manufacture of integrated circuits. More specifically, but without limitation thereto, the present invention is directed to methods of avoiding substrate noise in integrated circuits.

2. Description of the Prior Art

A typical design for an integrated circuit die includes N-type devices formed in N-type wells (N-wells) in a P-type substrate (P-substrate). The N-type devices are organized into APR (automatic placement and routing) blocks to perform a specific set of functions. Multiple N-type devices that are formed in the same P-substrate may receive and transmit switching noise through N-well openings through a surface boundary and through a side boundary of the P-substrate to adjacent N-type devices. The switching noise in the P-substrate is referred to as substrate noise. In a conventional design flow, the spacing between APR blocks is manually increased to reduce the substrate noise, which increases the parasitic resistance of the P-substrate and attenuates the substrate noise level between the N-type devices.

SUMMARY OF THE INVENTION

In one embodiment, a method of avoiding substrate noise in an integrated circuit includes steps of:
 (a) receiving as input from an integrated circuit design at least a portion of a block for placement and routing on a substrate and an outer boundary of the block;
 (b) selecting an end cell from a set of end cells for terminating the block in an outer area that extends from the outer boundary of the block to an end cell boundary outside the block; and
 (c) placing the selected end cell in the outer area to isolate the block electrically from the substrate.

In another embodiment, an apparatus includes:
 at least a portion of a block for placement and routing on a substrate and an outer boundary of the block; and
 an end cell selected from a set of end cells that terminates the block in an outer area that extends from the outer boundary of the block to an end cell boundary outside the block to isolate the block electrically from the substrate.

In a further embodiment, an apparatus includes:
 a set of end cells for terminating at least a portion of a block for placement and routing on a substrate of an integrated circuit to isolate the block electrically from the substrate.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

Figure 1:
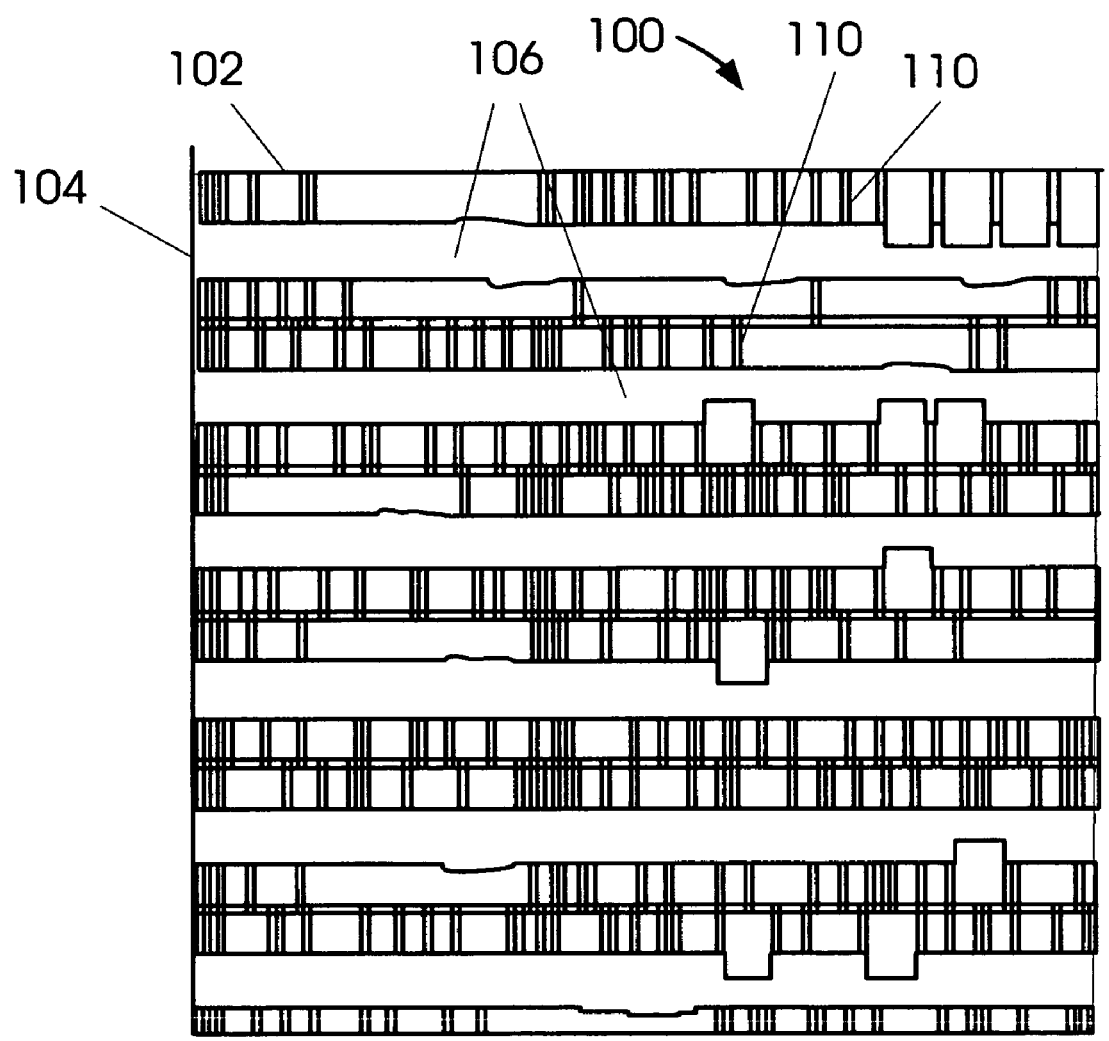
FIG. 1 illustrates a top view of a typical APR (automatic placement and routing) block formed in a substrate of an integrated circuit according to the prior art.

FIG. 1 illustrates a top view of a typical APR (automatic placement and routing) block 100 formed in a substrate of an integrated circuit according to the prior art. Shown in FIG. 1 are a surface outer boundary 102, a side outer boundary 104, P-substrate regions 106, and N-well regions 110.

In FIG. 1, the P-substrate regions 106 contain N-type devices implemented by a conventional design flow. However, the N-type devices are not fully enclosed by the N-well regions 110. Due to the openings in N-well regions 110 the at the side boundary 104, the N-type devices can transmit and receive switching noise through the openings in the N-wells 110 along the surface outer boundary 102 and through the side boundary 104 of the APR block 100. The switching noise that is transmitted through the P-substrate regions 106 is called substrate noise.

Figure 2:
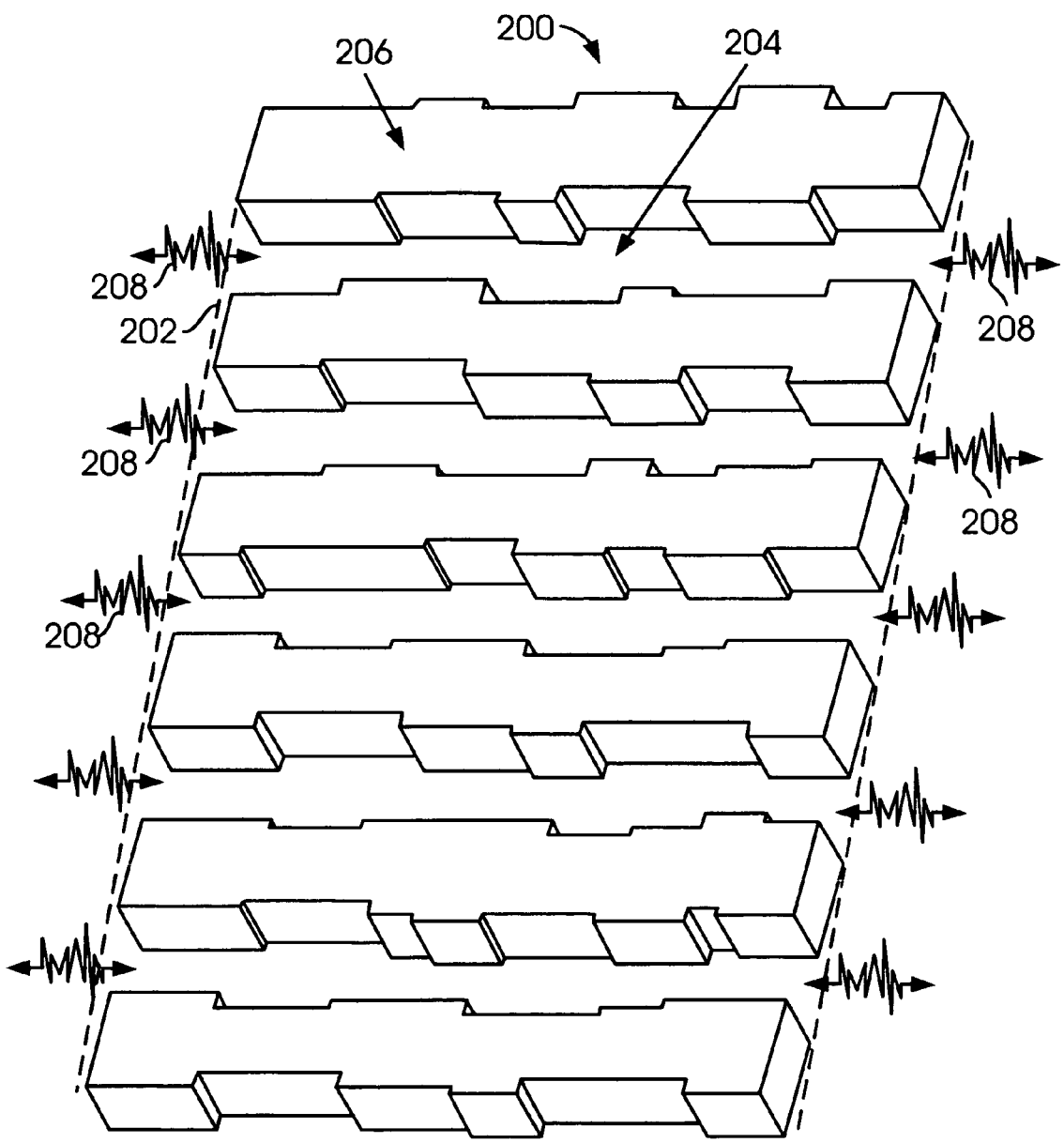
FIG. 2 illustrates a three-dimensional view of an automatic placement and routing block of the prior art.

FIG. 2 illustrates a three-dimensional view of an automatic placement and routing block 200 of the prior art. Shown in FIG. 2 are outer boundaries 202, P-substrate regions 204, N-well regions 206, and substrate noise 208.

In FIG. 2, the P-substrate regions 204 contain N-type devices such as NMOS (N-type metal oxide semiconductor). The substrate noise 208 propagates through the outer boundaries 202 to and from the P-substrate regions 204 and to the N-type devices formed in the P-substrate regions 204. In some cases, the substrate noise 208 may cause the integrated circuit to malfunction. Some methods have already been developed for avoiding substrate noise that may cause the integrated circuit to malfunction. In one approach, the substrate noise level is reduced by manually increasing the spacing between the N-type devices in the P-substrate regions 204.

Figure 3A:
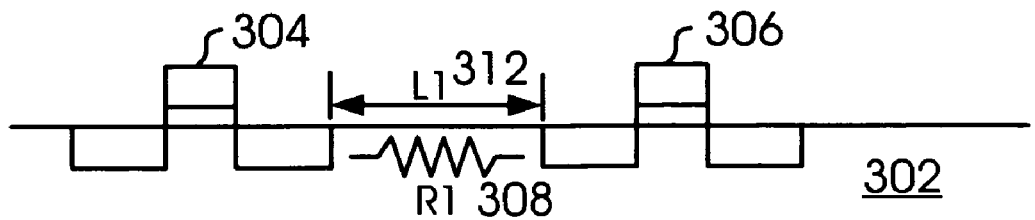
FIGS. 3A and 3B illustrate a configuration for reducing substrate noise by increasing the spacing between N-type devices in an APR block according to the prior art.
Figure 3B:
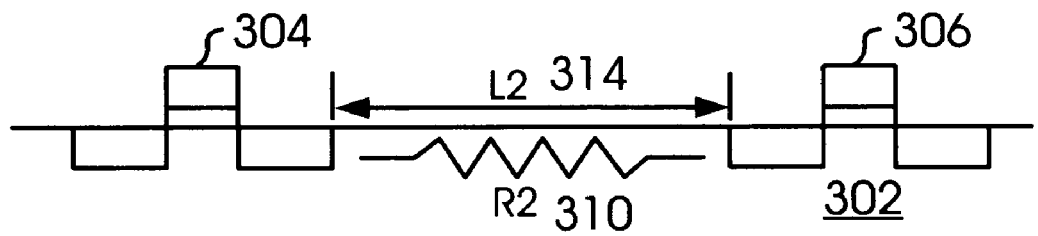

FIGS. 3A and 3B illustrate a configuration for reducing substrate noise by increasing the spacing between N-type devices in an APR block according to the prior art. Shown in FIGS. 3A and 3B are a P-substrate 302, N-type devices 304 and 306, parasitic substrate resistances 308 and 310, a standard N-type device spacing 312, and an increased device spacing 314.

In FIG. 3A, the standard N-type device spacing 312 results in a value of the parasitic substrate resistance 308 that has little effect on the substrate noise level coupled from the P-substrate 302 to the N-type devices 304 and 306. However, the increased device spacing 314 between the N-type devices 304 and 306 in FIG. 3B results in the parasitic substrate resistance 310 that has a higher value than the parasitic substrate resistance 308 resulting from the standard N-type device spacing 312. The higher value of the parasitic substrate resistance 310 results in attenuation of the substrate noise level coupled from the P-substrate 302 to the N-type devices 304 and 306.

Disadvantageously, the step of manually increasing the spacing 314 between the N-type devices 304 and 306 shown in FIG. 3B makes the APR physical implementation flow semi-automatic instead of automatic from the perspective of substrate noise reduction. In other words, manual intervention is generally required to increase the device spacing where needed in the integrated circuit design. Also, the increased spacing 314 requires a correspondingly larger die area, higher engineering costs for regenerating the floor plan, re-routing, timing analysis, die size enlargement, mask regeneration, silicon re-fabrication, and so on.

Figure 4:
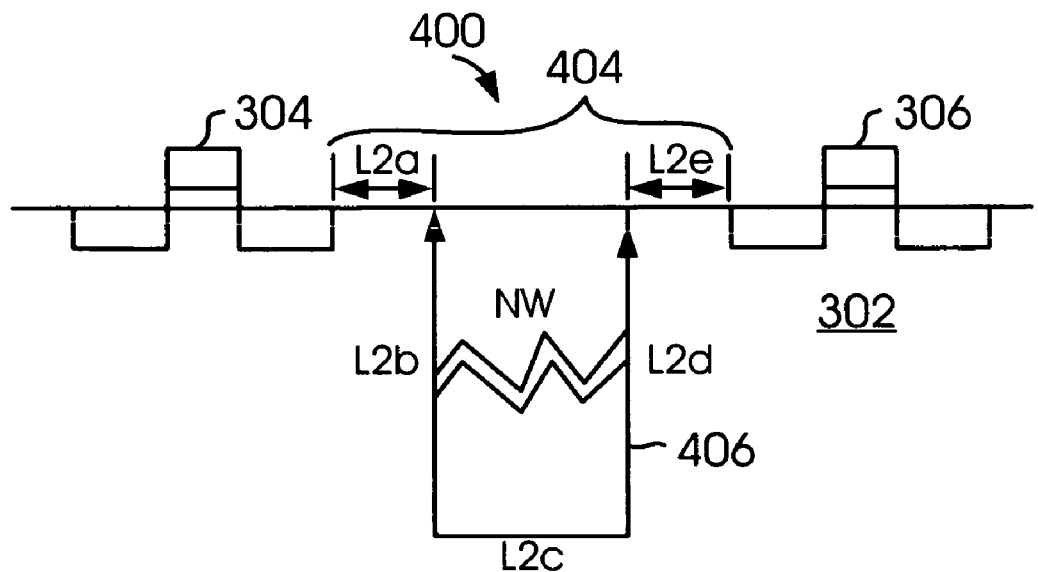
FIG. 4 illustrates a configuration for reducing substrate noise by forming an N-well between N-type devices in an APR block according to the prior art.

FIG. 4 illustrates a configuration 400 for reducing substrate noise by forming an N-well between N-type devices in an APR block according to the prior art. Shown in FIG. 4 are a P-substrate 302, N-type devices 304 and 306, an effective spacing 404, and an N-well 406.

In FIG. 4, the N-well 406 is formed in the P-substrate 302 between the N-type devices 304 and 306. Because the depth of the N-well 406 is typically much greater than the diffusion depth of the P-substrate 302, the effective spacing 404 (L2$a$+ L2$b$+L2C+L2$d$+L2$e$) is greater than the standard N-type device spacing 312 in FIG. 3A. While this approach has the same effect as increasing the spacing, it is generally costly, labor-intensive, and time-consuming to implement.

For system-on-a-chip designs that require complete substrate noise isolation between digital APR blocks and analog blocks, a deep N-well mask layer, that is, an N-type buried conductive layer, may be used as follows.

Figure 5:
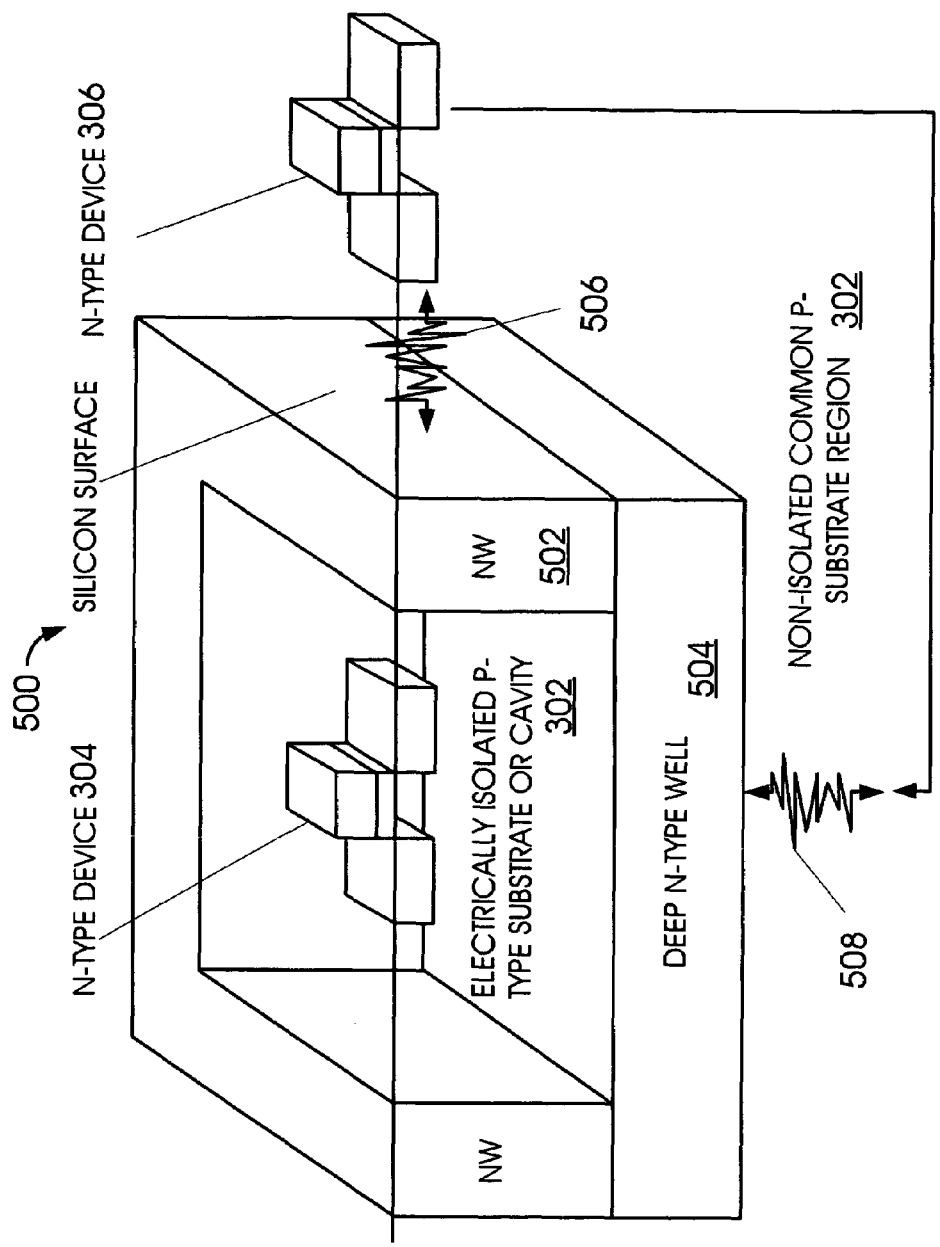
FIG. 5 illustrates a deep N-well mask configuration for reducing substrate noise between N-type devices in an APR block according to the prior art.
Figure 6A:
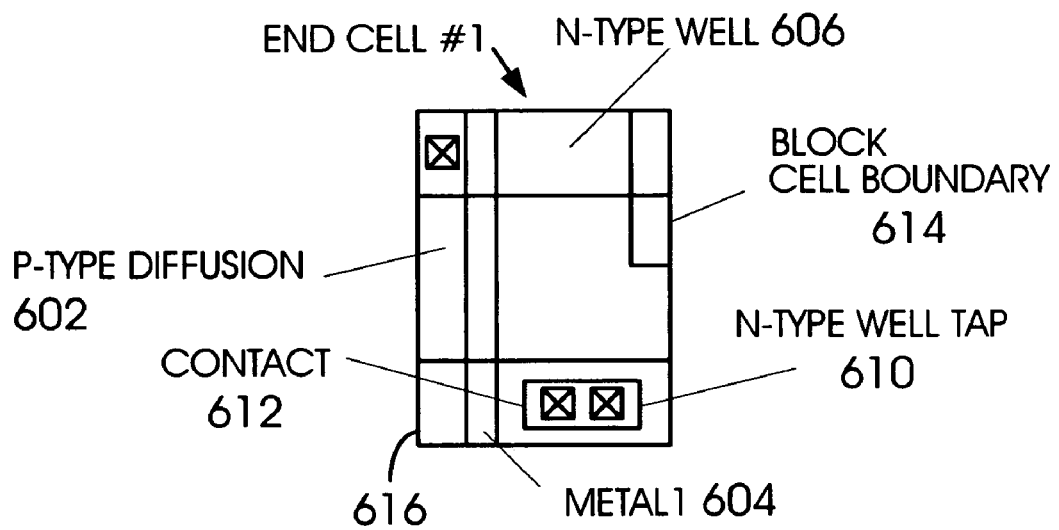
FIGS. 6A-6G illustrate a library of end cells for electrically isolating an automatic placement and routing block in an integrated circuit substrate.
Figure 6B:
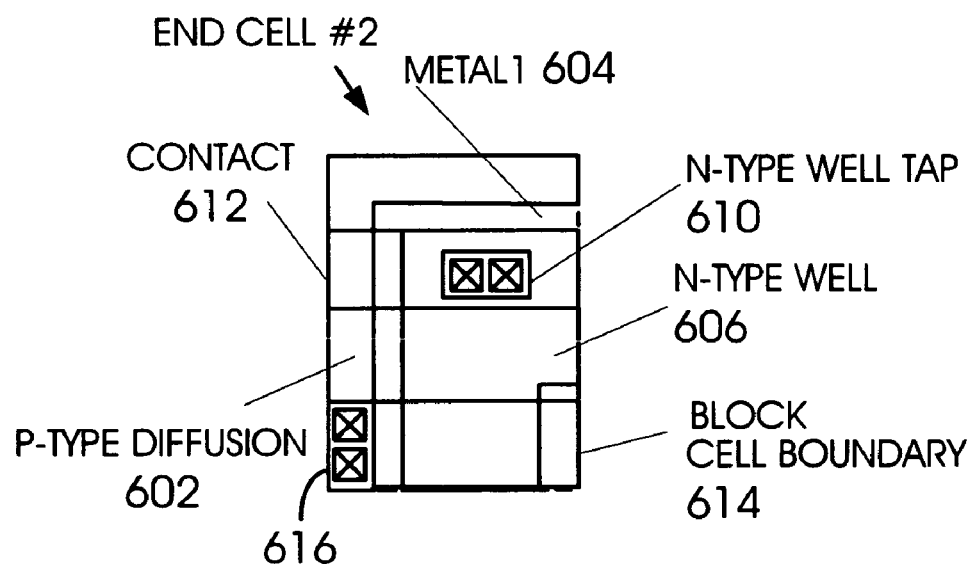
Figure 6C:
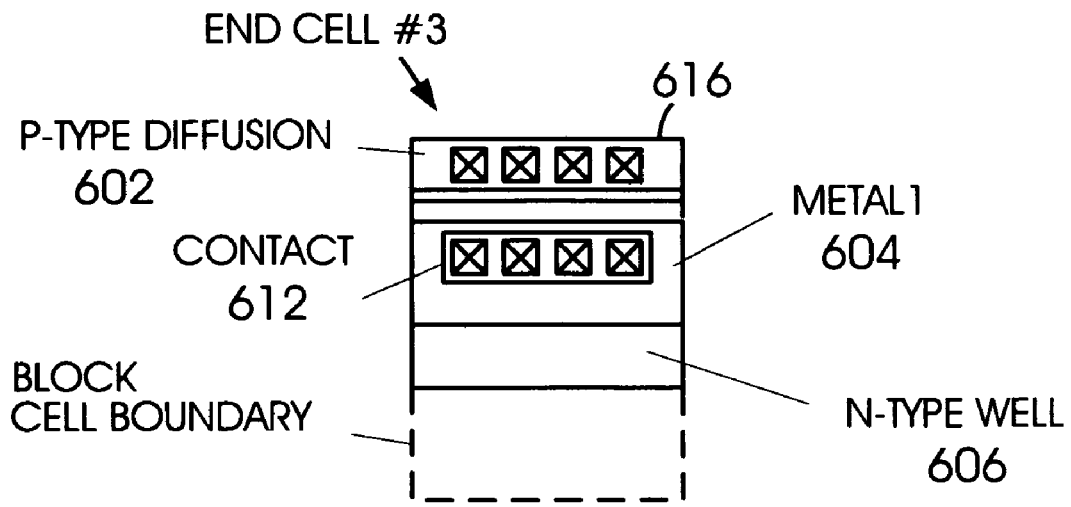
Figure 6D:
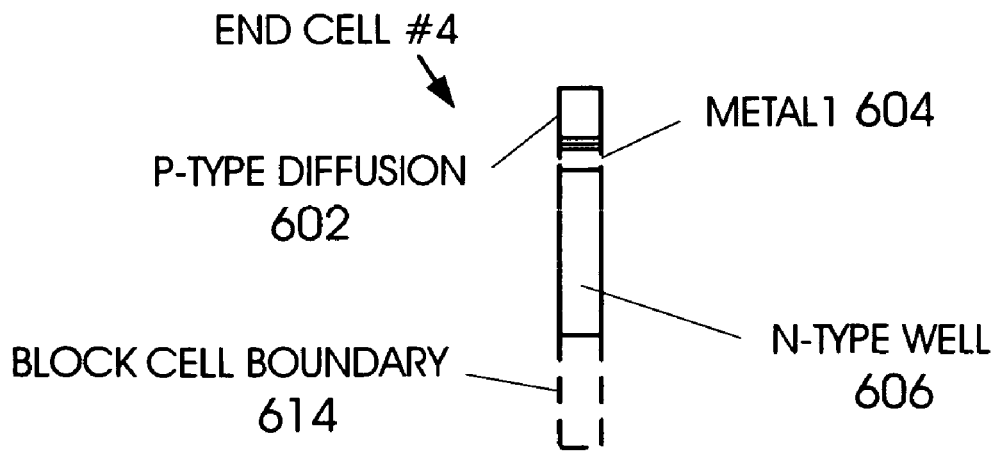
Figure 6E:
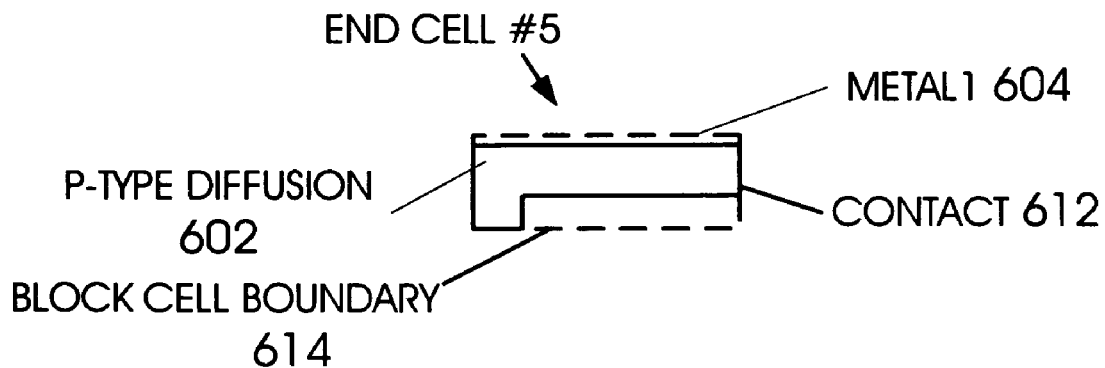
Figure 6F:
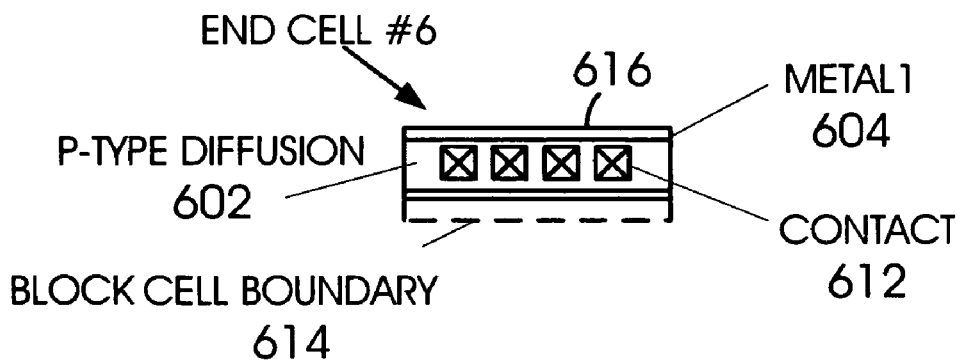
Figure 6G:
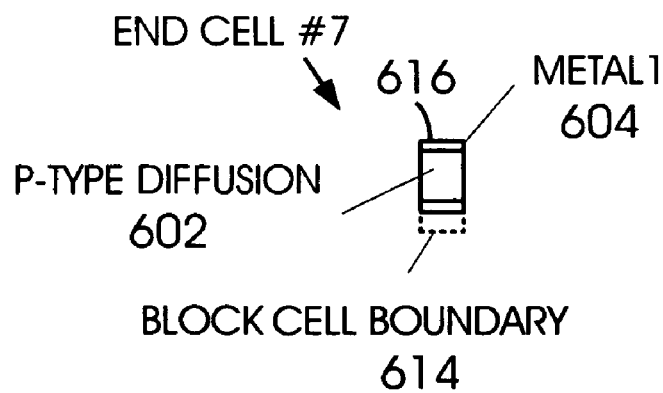

FIG. 5 illustrates a deep N-well mask configuration 500 for reducing substrate noise between N-type devices in an APR block according to the prior art. Shown in FIG. 5 are a P-substrate 302, N-type devices 304 and 306, an N-well 502, a deep N-well mask layer 504, and substrate noise 506 and 508.

In FIG. 5, complete substrate isolation is achieved by forming the deep N-well mask layer 504 in the P-substrate 302 to enclose the N-well 502. The deep N-well mask layer 504 and the N-well 502 electrically isolate the N-type device 304 from the bulk of the P-substrate 302 around the N-type device 306. As a result, the substrate noise 506 propagated long the surface of the P-substrate 302 and the substrate noise 508 propagated inside the P-substrate 302 below the N-type devices 304 and 306 is blocked from entering or leaving the isolated portion of the P-substrate 302 around the N-type device 304.

A method and end cell library are described below for avoiding substrate noise in an integrated circuit by terminating N-well openings between APR blocks with end cells selected from an end cell library. The ends cells advantageously close the N-well openings at the boundaries of the APR blocks to electrically isolate the P-substrate in each of the APR blocks from the P-substrate in each of the other APR blocks.

In one embodiment, an apparatus includes:

at least a portion of a block for placement and routing on a substrate and an outer boundary of the block; and an end cell selected from a set of end cells that terminates the block in an outer area that extends from the outer boundary of the block to an end cell boundary outside the block to isolate the block electrically from the substrate.

FIGS. 6A-6G illustrate a library of end cells for electrically isolating an automatic placement and routing block in an integrated circuit substrate. Shown in FIGS. 6A-6G are a P-type diffusion layer 602, a metal layer 604, an N-well layer 606, N-well taps 610, contacts 612, block cell boundaries 614, and end cell boundaries 616.

The P-type diffusion layer 602, the metal layer 604, the N-well layer 606, the N-well taps 610, and the contacts 612 are formed according to well known techniques in the same manner used for making APR blocks. In FIGS. 6A-6D, the P-type diffusion layer 602 is formed outside the metal layer 604, while in FIGS. 6E-6G, the P-type diffusion layer 602 and the metal layer 604 overlap. Because most substrate noise propagates in the upper portion of the P-substrate due to lower resistivity, the P-type diffusion layer 602 preferably has a depth of about 0.2 microns to attenuate the substrate noise. The metal layer 604 is optional to provide better substrate contact.

The N-well taps 610 reduce the resistance between the N-well layer 606 and the P-substrate. The contacts 612, the metal layer 604, and the P-type diffusion layer 602 form a sealring around the APR block by repeatedly selecting one of the end cells in FIGS. 6A-6G and placing the end cells in an area outside the APR block that extends from the block boundary 614 of the APR block to the end cell boundaries 616 as described below.

Figure 7:
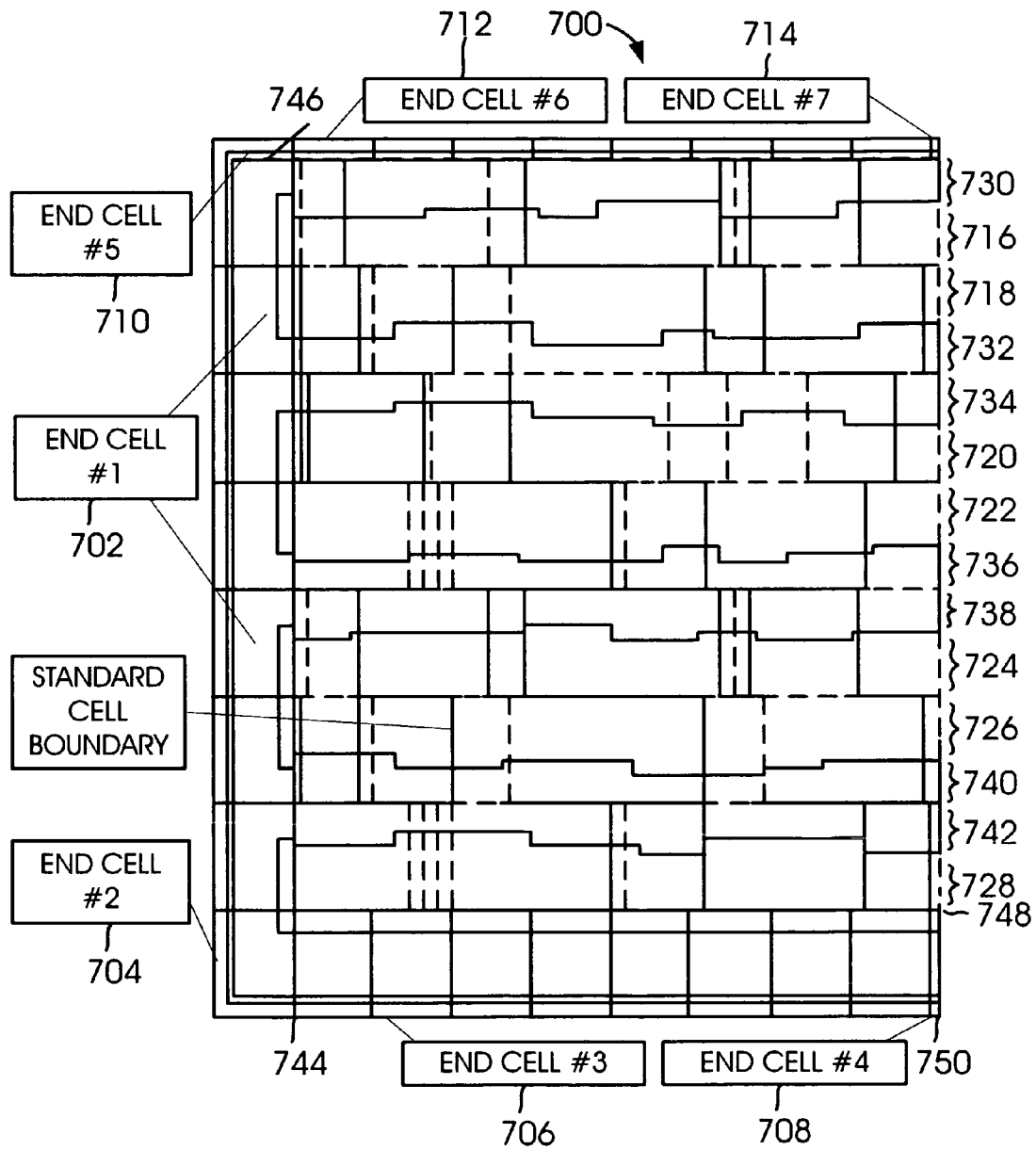
FIG. 7 illustrates an example of an automatic placement and routing block with an odd number of P-substrate rows after adding end cells selected from the end cell library of FIGS. 6A-6G.

FIG. 7 illustrates an example of an automatic placement and routing block 700 with an odd number of P-substrate rows after adding the end cells selected from the end cell library of FIGS. 6A-6G. Shown in FIG. 7 are end cells 702, 704, 706, 708, 710, 712 and 714, P-substrate regions 716, 718, 720, 722, 724, 726 and 728, N-well regions 730, 732, 734, 736, 738, 740 and 742, and outer boundaries 744, 746, 748 and 750.

In FIG. 7, each of the P-substrate regions 716, 718, 720, 722, 724, 726 share a common side to form a back-to-back pair. Similarly, each of the N-well regions 732, 734, 736, 738, 740 and 742 share a common side to form a back-to-back pair between each pair of P-substrate regions. The N-well region 730 is formed in the top P-substrate region 716, and the N-well region 742 is formed in the unpaired P-substrate region 728. The end cells 702, 704, 706, 708, 710, 712 and 714 are placed along the outer boundaries 744, 746 and 748 of the APR block 700 according to well-known cell placement techniques as shown to form a border that encloses the APR block 700. The border around the APR block 700 closes the openings in the N-well regions 732, 734, 736, 738, 740 and 742, isolating the APR block 700 from substrate noise. The outer boundary 750 is left open so that the APR block 700 may be joined to another APR block before completing the border.

Figure 8:
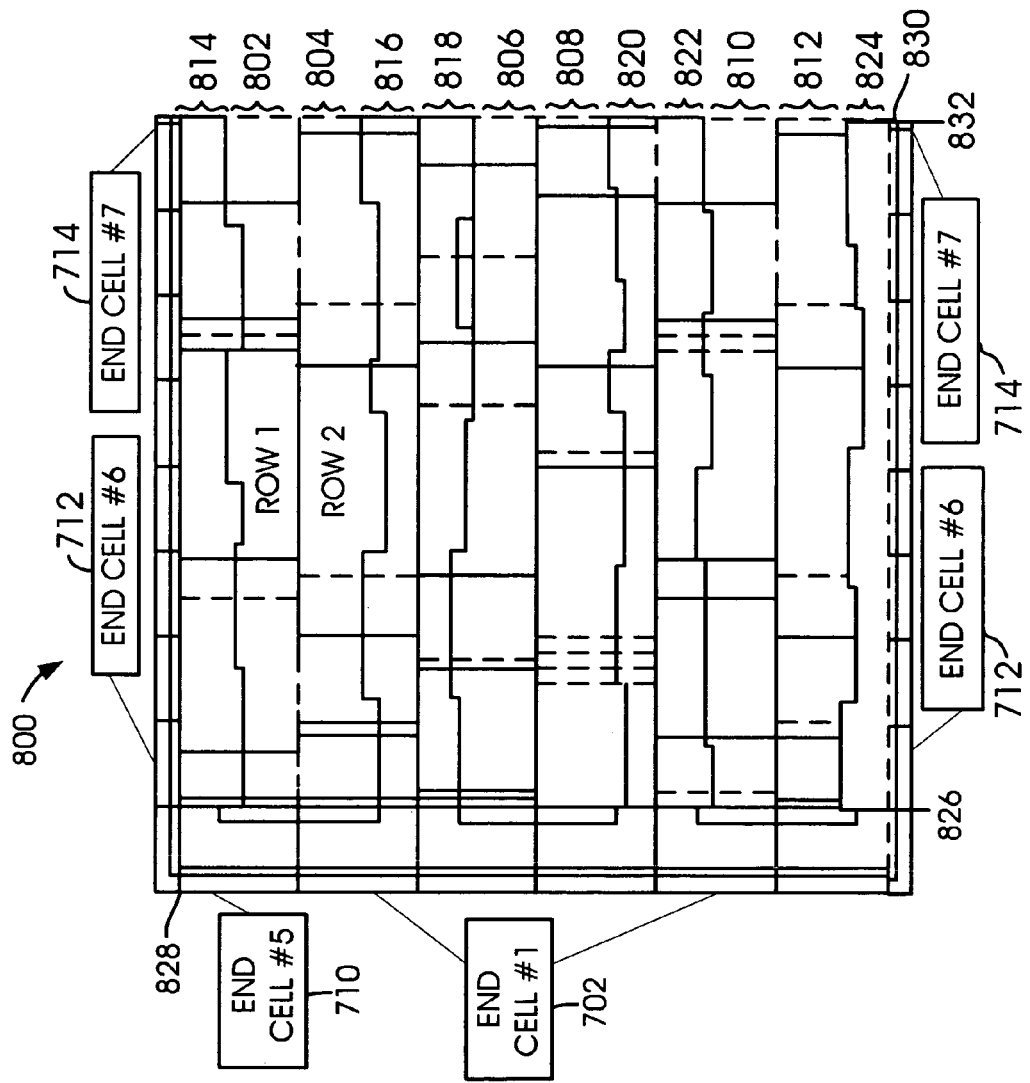
FIG. 8 illustrates an example of an automatic placement and routing block with an even number of P-substrate rows isolated after adding end cells selected from the end cell library of FIGS. 6A-6G.

FIG. 8 illustrates an example of an automatic placement and routing block 800 with an even number of P-substrate rows isolated after adding end cells selected from the end cell library of FIGS. 6A-6G. Shown in FIG. 8 are end cells 702, 710, 712 and 714, P-substrate regions 802, 804, 806, 808, 810 and 812, N-well regions 814, 816, 818, 820, 822 and 824, and outer boundaries 826, 828, 830 and 832.

In FIG. 8, each of the P-substrate regions 802, 804, 806, 808, 810 and 812 share a common side to form a back-to-back pair. Similarly, each of the N-well regions 816, 818, 820, 822 share a common side to form a back-to-back pair between each pair of P-substrate regions. The N-well region 814 is formed in the top P-substrate region 802, and the N-well region 824 is formed in the bottom paired P-substrate region 812. The end cells 702, 710, 712 and 714 are placed along the outer boundaries 826, 828, 830 of the APR block 800 as shown to form a border that encloses the APR block 800. The border around the APR block 800 closes the openings in the N-well regions 814, 816, 818, 820, 822 and 824, isolating the APR block 700 from substrate noise. The outer boundary 830 is left open so that the APR block 800 may be joined to another APR block before completing the border.

Figure 9:
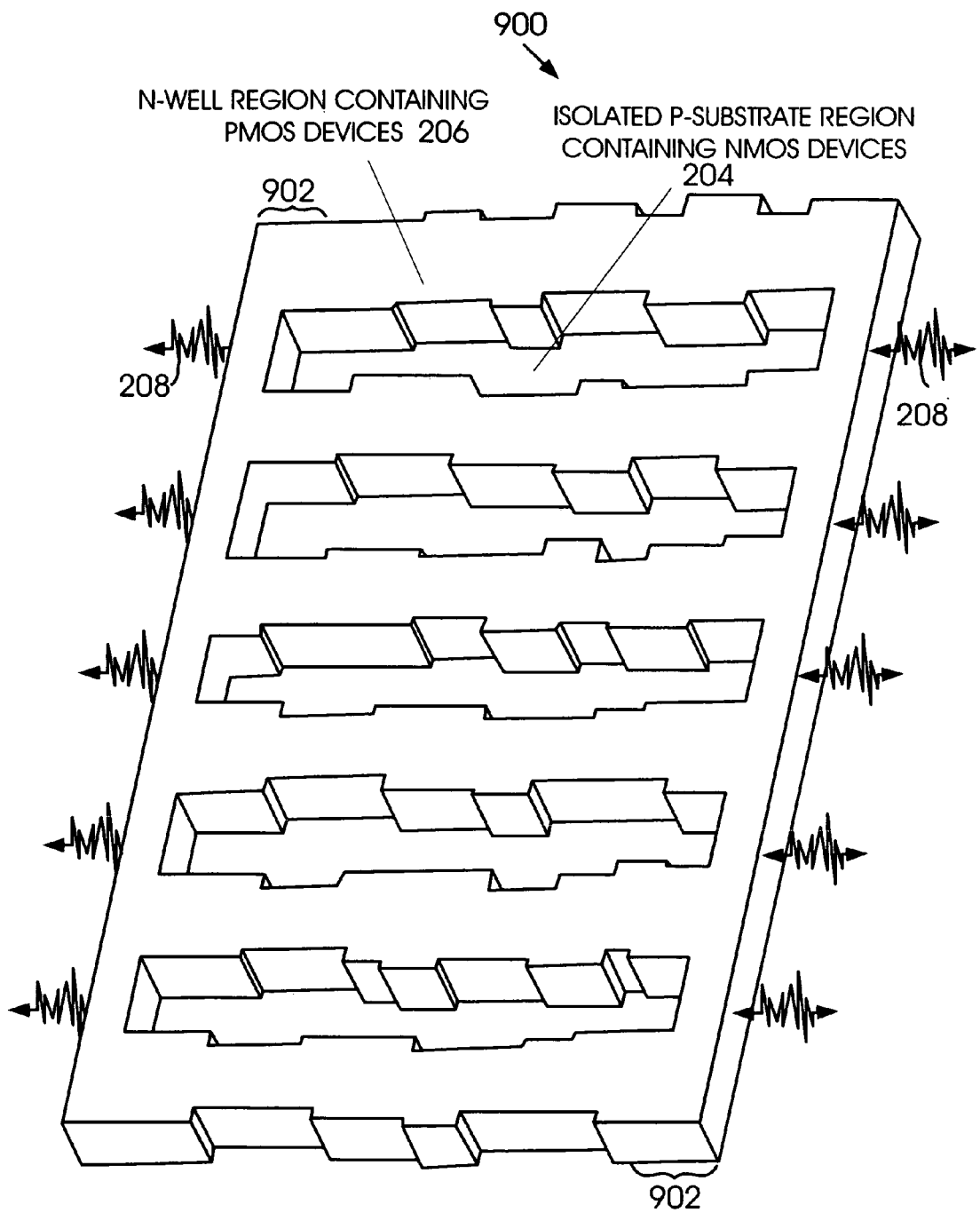
FIG. 9 illustrates a three-dimensional view of the automatic placement and routing block of FIG. 2 after adding end cells selected from the end cell library of FIGS. 6A-6G.

FIG. 9 illustrates a three-dimensional view of the automatic placement and routing block of FIG. 2 after adding end cells selected from the end cell library of FIGS. 6A-6G. Shown in FIG. 9 are P-substrate regions 204, N-well regions 206, substrate noise 208, and an end cell border 902.

In FIG. 9, the substrate noise 208 is blocked by the end cell border 902 that closes the openings in the N-well regions 206. The end cell border 902 may be formed, for example, from the end cells in the end cell library described above with reference to FIGS. 6A-6G, or from end cells having only an N-well layer, or from end cells that include an N-well layer and one or more of the other layers included in the end cells of FIGS. 6A-6G.

Figure 10:
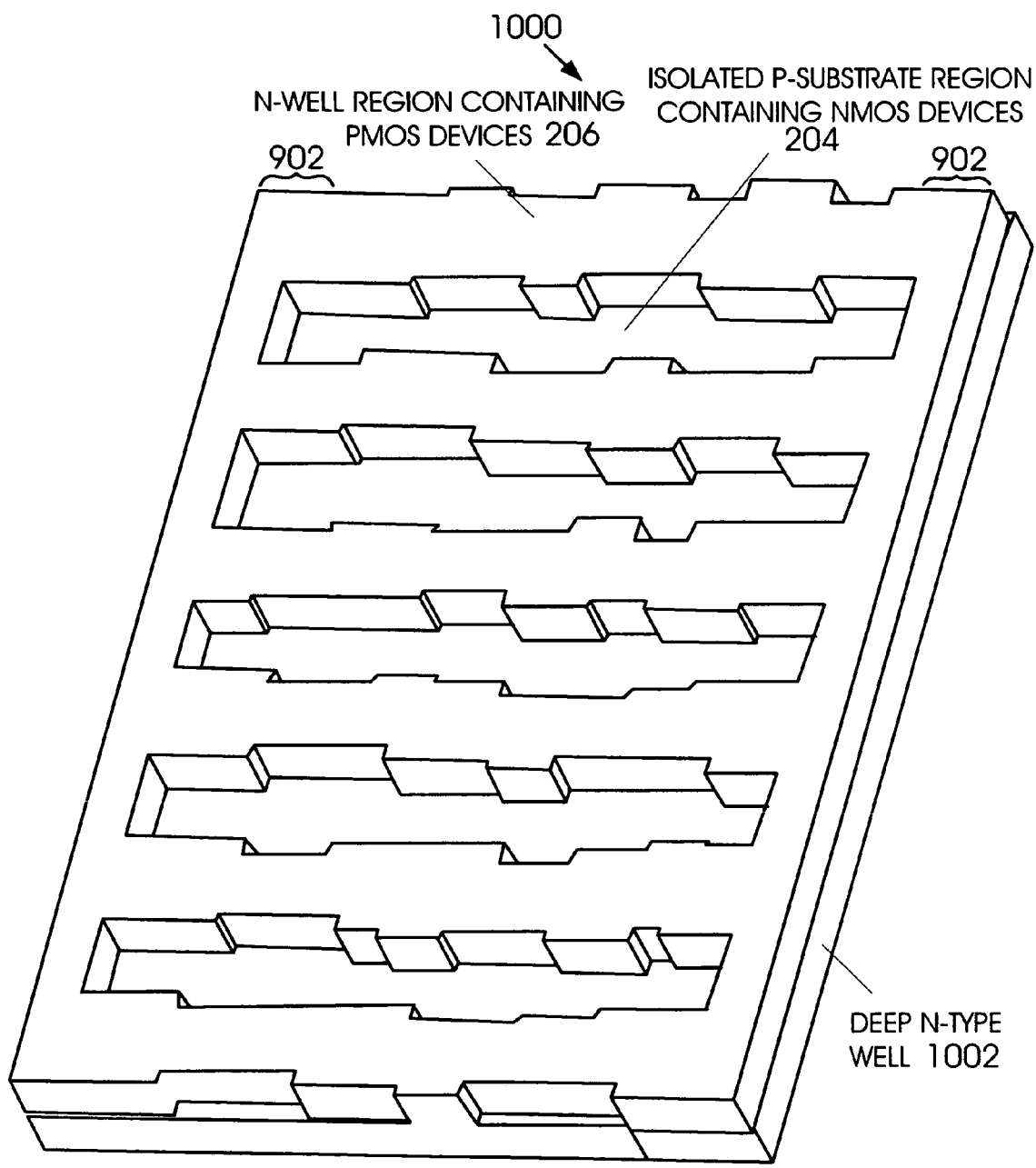
FIG. 10 illustrates a three-dimensional view of the automatic placement and routing block of FIG. 9 after adding a deep N-well mask layer.

FIG. 10 illustrates a three-dimensional view 1000 of the automatic placement and routing block of FIG. 9 after adding a deep N-well mask layer. Shown in FIG. 10 are P-substrate regions 204, N-well regions 206, an end cell border 902, and a deep N-well mask layer 1002.

In FIG. 10, the deep N-well mask layer 1002 is formed below the P-substrate regions 204 to electrically isolate the P-substrate regions 204 from substrate noise from the bottom as well as from the sides of the APR block.

Figure 11:
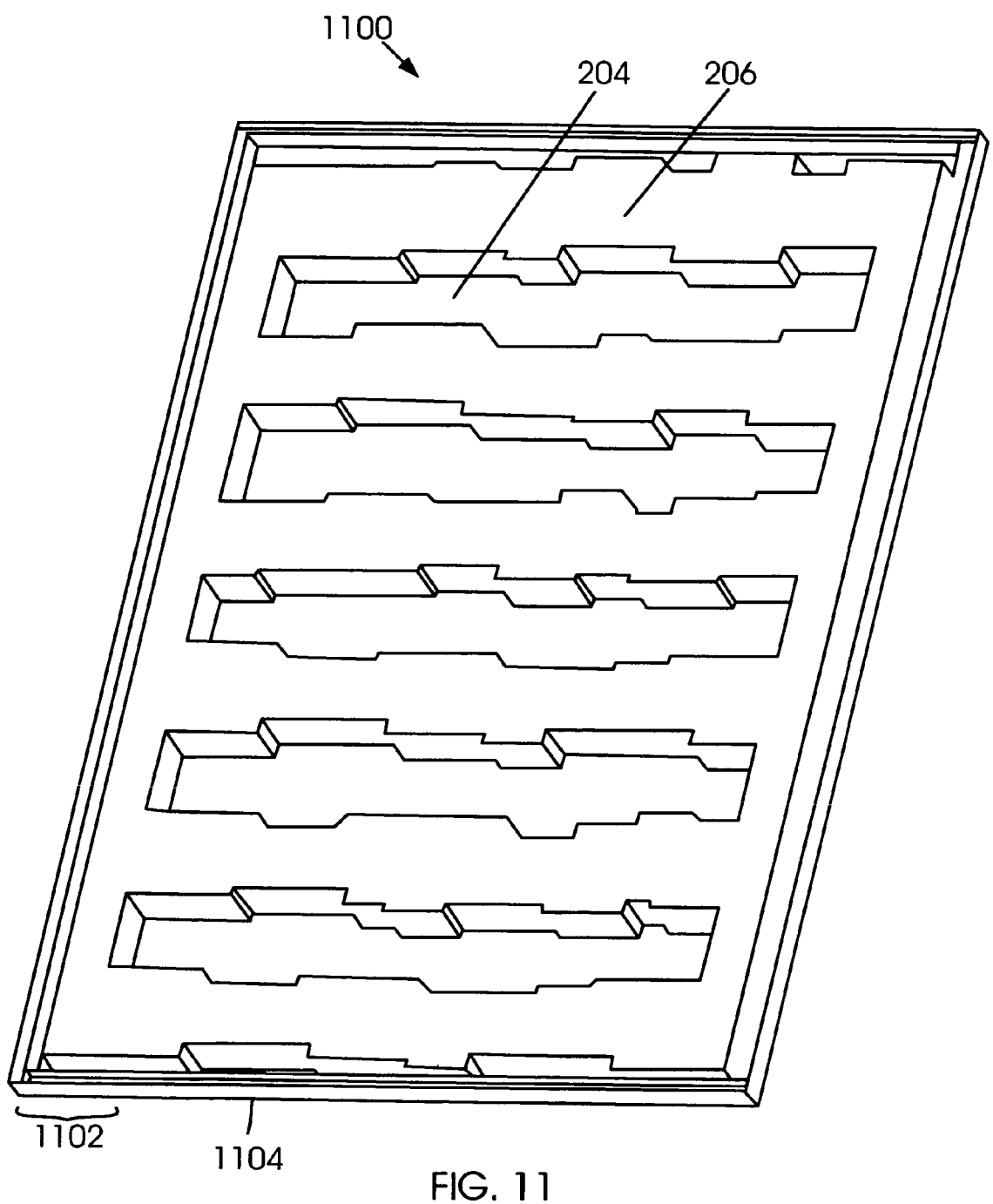
FIG. 11 illustrates a three-dimensional view of the automatic placement and routing block of FIG. 9 enclosed by a P-type guard ring.

FIG. 11 illustrates a three-dimensional view 1100 of the automatic placement and routing block of FIG. 9 enclosed by a guard ring. Shown in FIG. 11 are P-substrate regions 204, N-well regions 206, an end cell border 1102, and a P-type diffusion ring 1104.

In FIG. 11, the end cell border 1102 includes the P-type diffusion ring 1104 that encloses the APR block with an electrically conductive guard ring to provide additional attenuation of substrate noise that may be received or transmitted from the APR block.

In another embodiment, a method of avoiding substrate noise in an integrated circuit includes steps of:
  (a) receiving as input from an integrated circuit design at least a portion of a block for placement and routing on a substrate and an outer boundary of the block;
  (b) selecting an end cell from a set of end cells for terminating the block in an outer area that extends from the outer boundary of the block to an end cell boundary outside the block; and
  (c) placing the selected end cell in the outer area to isolate the block electrically from the substrate.

Figure 12:
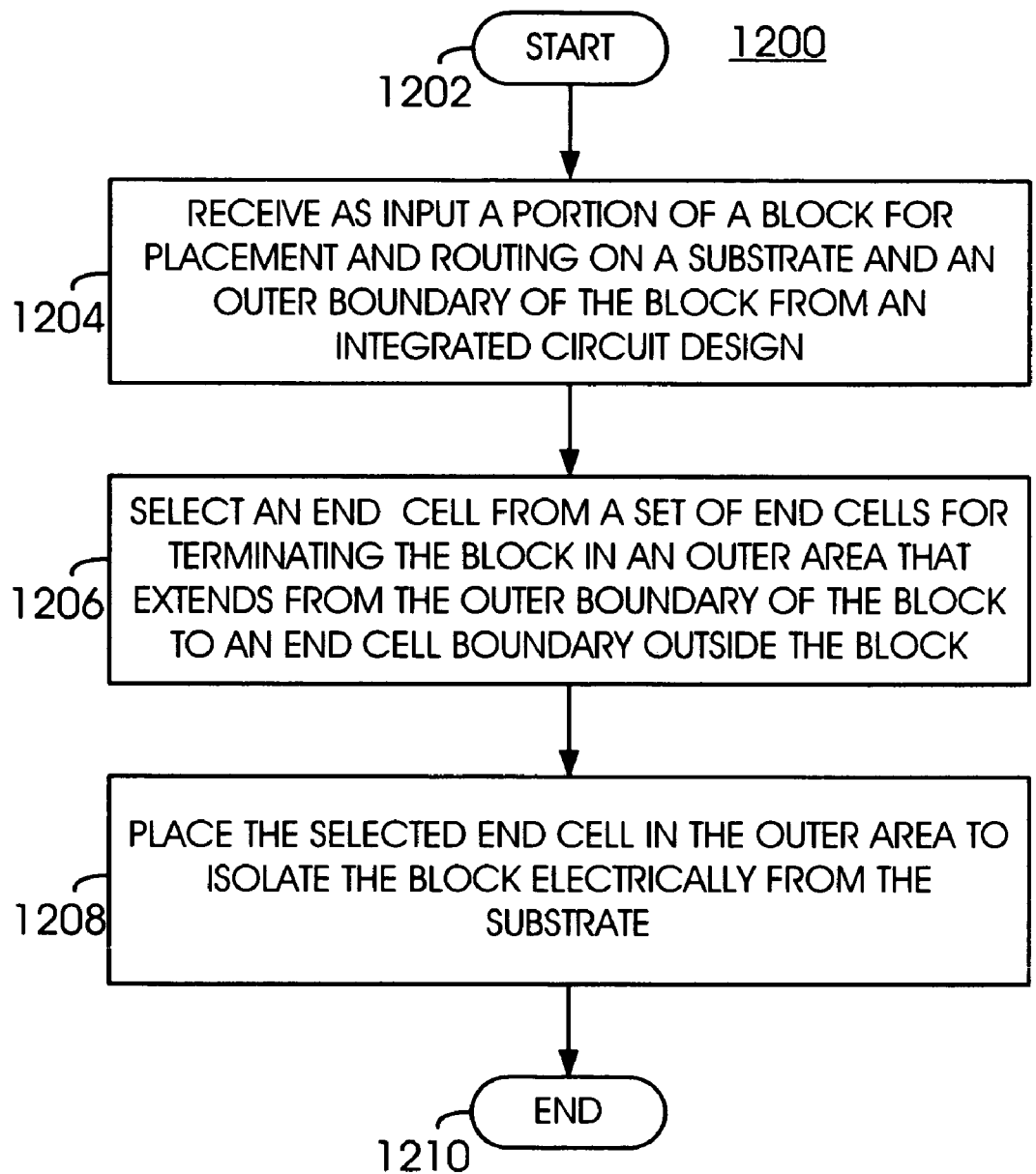
FIG. 12 illustrates a flow chart for a method of avoiding substrate noise with an end cell library.

FIG. 12 illustrates a flow chart 1200 for a method of avoiding substrate noise with an end cell library.

Step 1202 is the entry point for the flow chart 1200.

In step 1204, a portion of a block for placement and routing on a substrate and an outer boundary of the block is received as input from an integrated circuit design.

In step 1206, an end cell is selected from a set of end cells for terminating the block in an outer area that extends from the outer boundary of the block to an end cell boundary outside the block.

In step 1208, the selected end cell is placed in the outer area to isolate the block electrically from the substrate.

Step 1210 is the exit point for the flow chart 1200.

The flow chart described above with reference to FIG. 12 may also be automated by instructions for a computer. The instructions may be embodied in a disk, a CD-ROM, and other computer readable media according to well known computer programming techniques.

In another embodiment, a computer program product includes:
  a medium for embodying a computer program for input to a computer; and
  a computer program embodied in the medium for causing the computer to perform steps of:
  (a) receiving as input from an integrated circuit design at least a portion of a block for placement and routing on a substrate and an outer boundary of the block;
  (b) selecting an end cell from a set of end cells for terminating the block in an outer area that extends from the outer boundary of the block to an end cell boundary outside the block; and
  (c) placing the selected end cell in the outer area to isolate the block electrically from the substrate.

As may be appreciated from the above, APR blocks of an integrated circuit design may be terminated by end cells selected from a library of end cells that completely enclose N-type devices in each APR block in an N-well mesh and enclose the outer boundary of each APR block in a P-type guard ring. If further isolation from the P-substrate is needed by N-type devices in an APR block, a deep N-well mask layer may be added as described above with reference to FIG. 10.

In an embodiment of the method of FIG. 12 exemplified by FIGS. 6A-6G and FIG. 7, the library of end cells shown in FIGS. 6A-6G may be used to terminate an APR block according to the following steps:
  (a) receiving as input an integrated circuit design that includes at least a portion of a block for placement and routing on a substrate, the block comprising two N-well layers separated by a P-substrate layer, the N-well layers and the P-substrate layer extending to an outer boundary of the block;

(b) selecting an end cell from a pre-defined set of end cells, the end cell comprising a layer of an electrically conductive material to attenuate propagation of substrate noise; and (c) placing the selected end cell so that an area enclosed by the end cell extends outside the outer boundary to form a single segment of an electrically conductive ring enclosing the outer boundary.

In the embodiment of FIG. 7, the library of end cells shown in FIGS. 6A-6G may be used to terminate an APR block for placement and routing on a substrate in an integrated circuit design. The block includes two N-well layers separated by a P-substrate layer, and the N-well layers and the P-substrate layer extend from an outer boundary defined by a surface boundary and a side boundary of the block. An end cell selected from a pre-defined set of end cells includes a layer of an electrically conductive material to attenuate propagation of substrate noise. The end cell is placed so that an area enclosed by the end cell extends outside the outer boundary to form a single segment of an electrically conductive ring enclosing the outer boundary.

Although the flowchart description above is described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. A method comprising steps of:
   (a) receiving as input an integrated circuit design that includes at least a portion of a block for placement and routing on a substrate, the block comprising two N-well layers separated by a P-substrate layer, the N-well layers and the P-substrate layer extending to an outer boundary enclosing the block;
   (b) selecting an end cell from a pre-defined set of end cells, the end cell comprising a layer of an electrically conductive material to attenuate propagation of substrate noise; and
   (c) placing the selected end cell along the outer boundary so that an area enclosed by the end cell extends outside the outer boundary to form a single segment of an electrically conductive ring, the electrically conductive ring enclosing the outer boundary to isolate the block from substrate noise and to terminate the portion of the block in the integrated circuit design.

2. The method of claim 1 further comprising repeating steps (b) and (c) to complete the electrically conductive ring.

3. The method of claim 1 further comprising a step of generating the pre-defined set of end cells.

4. The method of claim 3 wherein step (b) comprises selecting the end cell comprising a P-type layer for terminating the P-substrate layer at the outer boundary.

5. The method of claim 4 further comprising selecting the end cell comprising an N-well region formed outside the P-substrate layer.

6. The method of claim 5 further comprising selecting the end cell comprising an electrically conductive layer formed outside the N-well region.

7. The method of claim 6 further comprising selecting the end cell comprising an electrically conductive layer that comprises one of a P-type layer and a metal layer.

8. The method of claim 3 wherein step (b) comprises selecting the end cell comprising an electrically conductive layer for terminating the N-well layer at the outer boundary.

9. An apparatus comprising:
   at least a portion of a block for placement and routing on a substrate in an integrated circuit design, the block comprising two N-well layers separated by a P-substrate layer, the N-well layers and the P-substrate layer extending to an outer boundary enclosing the block; and
   an end cell selected from a pre-defined set of end cells, the end cell comprising a layer of an electrically conductive material to attenuate propagation of substrate noise, the end cell placed along the outer boundary so that an area enclosed by the end cell extends outside the outer boundary to form a single segment of an electrically conductive ring, the electrically conductive ring enclosing the outer boundary to isolate the block from substrate noise and to terminate the portion of the block in the integrated circuit design.

10. The apparatus of claim 9 further comprising multiple end cells selected from the pre-defined set of end cells to complete the electrically conductive ring.

11. The apparatus of claim 9 further comprising the pre-defined set of end cells.

12. The apparatus of claim 9, the end cell further comprising a P-type layer for terminating the P-substrate layer at the outer boundary.

13. The apparatus of claim 12 further comprising an N-well region formed in the end cell outside the P-substrate layer.

14. The apparatus of claim 13 further comprising an electrically conductive layer formed in the end cell outside the N-well region.

15. The apparatus of claim 14, the electrically conductive layer comprising one of a P-type layer and a metal layer.

16. The apparatus of claim 9, the end cell comprising an electrically conductive layer for terminating the N-well layer at the outer boundary.

17. An apparatus comprising:
   a set of pre-defined end cells for terminating at least a portion of a block for placement and routing on a substrate of an integrated circuit design, the block comprising two N-well layers separated by a P-substrate layer, the N-well layers and the P-substrate layer extending to an outer boundary enclosing the block, each end cell comprising a layer of an electrically conductive material to attenuate propagation of substrate noise when the end cell is placed along the outer boundary so that an area enclosed by the end cell extends outside the outer boundary to form a single segment of an electrically conductive ring, the electrically conductive ring enclosing the outer boundary to isolate the block from substrate noise and to terminate the portion of the block in the integrated circuit design.

* * * * *